(12) United States Patent
Erickson et al.

(10) Patent No.: US 10,418,094 B2
(45) Date of Patent: *Sep. 17, 2019

(54) PREDICTING DATA CORRELATION USING MULTIVALUED LOGICAL OUTPUTS IN STATIC RANDOM ACCESS MEMORY (SRAM) STORAGE CELLS

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 30 days.

This patent is subject to a terminal disclaimer.

(21) Appl. No.: 15/892,037

(22) Filed: Feb. 8, 2018

(65) Prior Publication Data

US 2018/0240512 A1  Aug. 23, 2018

Related U.S. Application Data

(63) Continuation of application No. 15/437,482, filed on Feb. 21, 2017, now Pat. No. 9,916,890.

(51) Int. Cl.
*G06F 17/20* (2006.01)
*G11C 11/419* (2006.01)
(Continued)

(52) U.S. Cl.
CPC .............. *G11C 11/419* (2013.01); *G11C 7/12* (2013.01); *G11C 11/418* (2013.01); *G11C 29/50* (2013.01); *G11C 2029/5004* (2013.01)

(58) Field of Classification Search
CPC ...................................................... G06F 17/30
(Continued)

(56) References Cited

U.S. PATENT DOCUMENTS 3,076,933 A   2/1963   Negrete
4,561,089 A   12/1985  Rouse et al.
(Continued)

OTHER PUBLICATIONS

U.S. Appl. No. 16/000,207, to to Karl R. Erickson et al., entitled, *Optimizing Data Approximation Analysis Using Low Power Circuitry*, assigned to International Business Machines Corporation, 34 pages, filed Jun. 5, 2018.
(Continued)

*Primary Examiner* — Min Huang
(74) *Attorney, Agent, or Firm* — Nathan M. Rau

(57) ABSTRACT

Predicting data correlation using multivalued logical outputs in SRAM storage cells including generating a plurality of logical outputs for each of a plurality of variable sets, wherein each variable in each variable set is a data point, and wherein each logical output is a binary indication of a relationship between the data points; writing, into storage cells, each logical output of the plurality of logical outputs for each of the plurality of variable sets; and for each group of corresponding logical outputs of the plurality of logical outputs: activating a fight port for the storage cells storing corresponding logical outputs, wherein activating the fight port causes each corresponding logical output to adjust a resulting voltage based on the logical output stored in each storage cell; and measuring the resulting voltage on a bitline of the activated fight port to determine a correlation probability for the corresponding logical outputs.

20 Claims, 5 Drawing Sheets

(51) Int. Cl.
  *G11C 29/50* (2006.01)
  *G11C 7/12* (2006.01)
  *G11C 11/418* (2006.01)

(58) Field of Classification Search
  USPC .................................................... 365/207
  See application file for complete search history.

(56) References Cited

U.S. PATENT DOCUMENTS

| | | | |
|---|---|---|---|
| 4,800,518 A | | 1/1989 | Miller |
| 4,802,103 A | | 1/1989 | Faggin et al. |
| 5,376,915 A | * | 12/1994 | Takeuchi ............... G06F 7/026 326/105 |
| 5,497,121 A | | 3/1996 | D'Hont |
| 5,768,501 A | | 6/1998 | Lewis |
| 6,081,468 A | | 6/2000 | Taira et al. |
| 6,130,568 A | | 10/2000 | Kwon et al. |
| 6,154,864 A | | 11/2000 | Merritt |
| 6,982,431 B2 | | 1/2006 | Modlin et al. |
| 7,084,695 B2 | | 8/2006 | Porter |
| 7,111,260 B2 | | 9/2006 | Visweswariah |
| 7,139,743 B2 | * | 11/2006 | Indeck ................... G06Q 40/00 |
| 8,909,592 B2 | * | 12/2014 | Stergiou .............. G06F 19/3418 706/59 |
| 9,000,837 B1 | | 4/2015 | Fifield |
| 9,082,495 B2 | | 7/2015 | Lee et al. |
| 9,093,175 B2 | | 7/2015 | Barth, Jr. et al. |
| 9,147,144 B2 | | 9/2015 | Potyrailo et al. |
| 9,147,457 B2 | | 9/2015 | Kim et al. |
| 9,367,853 B2 | * | 6/2016 | Cronin .............. G06Q 30/0201 |
| 9,411,009 B1 | | 8/2016 | Aguayo Gonzalez et al. |
| 9,478,303 B1 | | 10/2016 | Parker |
| 9,508,424 B2 | | 11/2016 | Lee |
| 9,916,890 B1 | * | 3/2018 | Erickson ............... G11C 11/419 |
| 10,037,792 B1 | | 7/2018 | Erickson et al. |
| 10,043,568 B1 | | 8/2018 | Erickson et al. |
| 2002/0159319 A1 | | 10/2002 | Kirihata et al. |
| 2007/0070754 A1 | | 3/2007 | Vogelsang |
| 2008/0313510 A1 | | 12/2008 | Baker |
| 2010/0182859 A1 | | 7/2010 | Kohler et al. |
| 2014/0063915 A1 | | 3/2014 | Cronie et al. |
| 2014/0122925 A1 | * | 5/2014 | Peake ................... G06F 11/10 714/6.24 |
| 2014/0201426 A1 | * | 7/2014 | Ma ...................... G06F 12/0246 711/103 |
| 2014/0293715 A1 | | 10/2014 | Barth, Jr. et al. |
| 2015/0016193 A1 | * | 1/2015 | Lewis .................. G06F 21/79 365/189.02 |
| 2015/0281612 A1 | | 10/2015 | Lund et al. |
| 2017/0220918 A1 | | 8/2017 | Entner |
| 2018/0218766 A1 | | 8/2018 | Erickson et al. |
| 2018/0348271 A1 | | 12/2018 | Erickson et al. |
| 2018/0348272 A1 | | 12/2018 | Erickson et al. |
| 2018/0348273 A1 | | 12/2018 | Erickson et al. |
| 2018/0348274 A1 | | 12/2018 | Erickson et al. |
| 2018/0349774 A1 | | 12/2018 | Erickson et al. |
| 2018/0349775 A1 | | 12/2018 | Erickson et al. |
| 2018/0350422 A1 | | 12/2018 | Erickson et al. |
| 2018/0350423 A1 | | 12/2018 | Erickson et al. |

OTHER PUBLICATIONS

U.S. Appl. No. 16/001,420, to to Karl R. Erickson et al., entitled, *Optimizing Data Approximation Analysis Using Low Power Circuitry*, assigned to International Business Machines Corporation, 34 pages, filed Jun. 6, 2018.

Appendix P; List of IBM Patent or Applications Treated as Related, Sep. 14, 2018, 2 pages.

Carstens, *Open Bit Line Sensing: Writing Dummy Cells for Test Purpose*, An IP.com Prior Art Database Technical Disclosure, IP.com No. IPCOM000174809D, Qimonda 2008, Original Publication Date: Oct. 13, 2008, 2 pages.

Kozma et al., *A Low-Power Current-Mode Correlation Detector with Analog Data Storage*, 2004 IEEE Region 10 Conference (TENCON 2004), Nov. 2004, vol. 2, pp. 442-445, IEEE Xplore Digital Library (ieee.org) online, DOI: 10.1109/TENCON.2004.1414627, URL: ieeexplore.ieee.org/abstract/document/1414627/.

*Voltage Comparator, Chapter 6—Analog Integrated Circuits*, All About Circuits, Electronics Textbook, <https://www.allaboutcircuits.com/textbook/experiments/chpt-6/voltage-comparator/>, EETech Media, LLC, printed Mar. 10, 2017, 3 pages.

U.S. Appl. No. 15/437,482, to Karl R. Erickson et al., entitled, *Predicting Data Correlation Using Multivalued Logical Outputs in Static Random Access Memory (SRAM) Storage Cells*, assigned to International Business Machines Corporation, 29 pages, filed Feb. 21, 2017.

U.S. Appl. No. 15/420,679, to Karl R. Erickson et al., entitled, *Big Data Analysis Using Low Power Circuit Design*, assigned to International Business Machines Corporation, 31 pages, filed Jan. 31, 2017.

U.S. Appl. No. 15/612,272, to Karl R. Erickson et al., entitled, *Real Time Cognitive Reasoning Using a Circuit With Varying Confidence Level Alerts*, assigned to International Business Machines Corporation, 41 pages, filed Jun. 2, 2017.

U.S. Appl. No. 15/612,360, to Karl R. Erickson et al., entitled, *Cognitive Analysis Using Applied Analog Circuits*, assigned to International Business Machines Corporation, 37 pages, filed Jun. 2, 2017.

U.S. Appl. No. 15/612,433, to Karl R. Erickson et al., entitled, *Real Time Cognitive Monitoring of Correlations Between Variables*, assigned to International Business Machines Corporation, 41 pages, filed Jun. 2, 2017.

U.S. Appl. No. 15/612,316, to Karl R. Erickson et al., entitled, *Optimizing Data Approximation Analysis Using Low Power Circuitry*, assigned to International Business Machines Corporation, 34 pages, filed Jun. 2, 2017.

U.S. Appl. No. 15/822,479, to Karl R. Erickson et al., entitled, *Optimizing Data Approximation Analysis Using Low Power Circuitry*, assigned to International Business Machines Corporation, 28 pages, filed Nov. 27, 2017.

U.S. Appl. No. 15/820,301, to Karl R. Erickson et al., entitled, *Real Time Cognitive Monitoring of Correlations Between Variables*, assigned to International Business Machines Corporation, 34 pages, filed Nov. 21, 2017.

U.S. Appl. No. 15/818,929, to Karl R. Erickson et al., entitled, *Cognitive Analysis Using Applied Analog Circuits*, assigned to International Business Machines Corporation, 31 pages, filed Nov. 21, 2017.

U.S. Appl. No. 15/818,977, to Karl R. Erickson et al., entitled, *Real Time Cognitive Reasoning Using a Circuit With Varying Confidence Level Alerts*, assigned to International Business Machines Corporation, 36 pages, filed Nov. 21, 2017.

Appendix P; List of Patents or Applications Treated as Related, Feb. 27, 2018, 2 pages.

* cited by examiner

US 10,418,094 B2

PREDICTING DATA CORRELATION USING MULTIVALUED LOGICAL OUTPUTS IN STATIC RANDOM ACCESS MEMORY (SRAM) STORAGE CELLS

CROSS-REFERENCE TO RELATED APPLICATION

This application is a continuation application of U.S. patent application Ser. No. 15/437,482, filed Feb. 21, 2017.

BACKGROUND

Field of the Invention

The field of the invention is data processing, or, more specifically, methods, apparatus, and products for predicting data correlation using multivalued logical outputs in static random access memory (SRAM) storage cells.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for predicting data correlation using multivalued logical outputs in static random access memory (SRAM) storage cells are disclosed in this specification. Predicting data correlation using multivalued logical outputs in SRAM storage cells includes generating a plurality of logical outputs for each of a plurality of variable sets, wherein each variable in each variable set is a data point, and wherein each logical output is a binary indication of a relationship between the data points of each variable set; writing, into static random access memory (SRAM) storage cells, each logical output of the plurality of logical outputs for each of the plurality of variable sets; and for each group of corresponding logical outputs of the plurality of logical outputs: activating a fight port for the SRAM storage cells storing corresponding logical outputs, wherein activating the fight port causes each corresponding logical output to adjust a resulting voltage based on the logical output stored in each SRAM storage cell; and measuring the resulting voltage on a bitline of the activated fight port to determine a correlation probability for the corresponding logical outputs.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
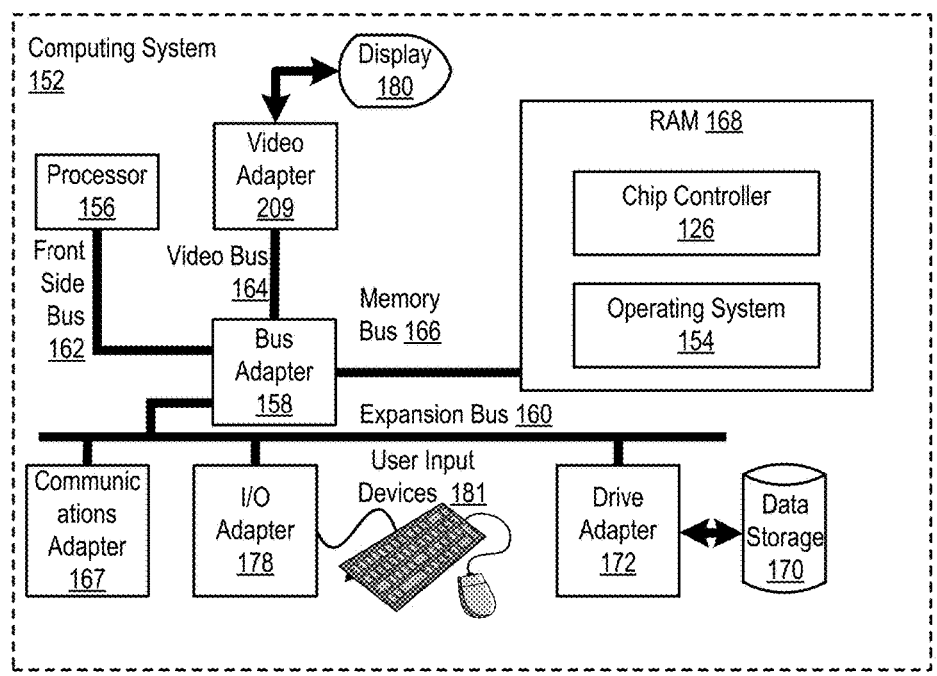
FIG. 1 sets forth a block diagram of an example system configured for predicting data correlation using multivalued logical outputs in static random access memory (SRAM) storage cells according to embodiments of the present invention.

Exemplary methods, apparatus, and products for predicting data correlation using multivalued logical outputs in static random access memory (SRAM) storage cells in accordance with the present invention are described with reference to the accompanying drawings, beginning with FIG. 1. FIG. 1 sets forth a block diagram of automated computing machinery comprising an exemplary computing system (152) configured for predicting data correlation using multivalued logical outputs in SRAM storage cells according to embodiments of the present invention. The computing system (152) of FIG. 1 includes at least one computer processor (156) or 'CPU' as well as random access memory (168) (RAM') which is connected through a high speed memory bus (166) and bus adapter (158) to processor (156) and to other components of the computing system (152).

Stored in RAM (168) is an operating system (154). Operating systems useful in computers configured for predicting data correlation using multivalued logical outputs in static random access memory (SRAM) storage cells according to embodiments of the present invention include UNIX™, Linux™, Microsoft XP™, AIX™, IBM's iOS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) is a chip controller (126), a module of computer program instructions for predicting data correlation using multivalued logical outputs in static random access memory (SRAM) storage cells.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for predicting data correlation using multivalued logical outputs in static random access memory (SRAM) storage cells according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for predicting data correlation using multivalued logical outputs in static random access memory (SRAM) storage cells according to embodiments of the present invention include modems for wired dial-up communications, Ethernet (IEEE 802.3) adapters for wired data communications, and 802.11 adapters for wireless data communications.

Figure 2:
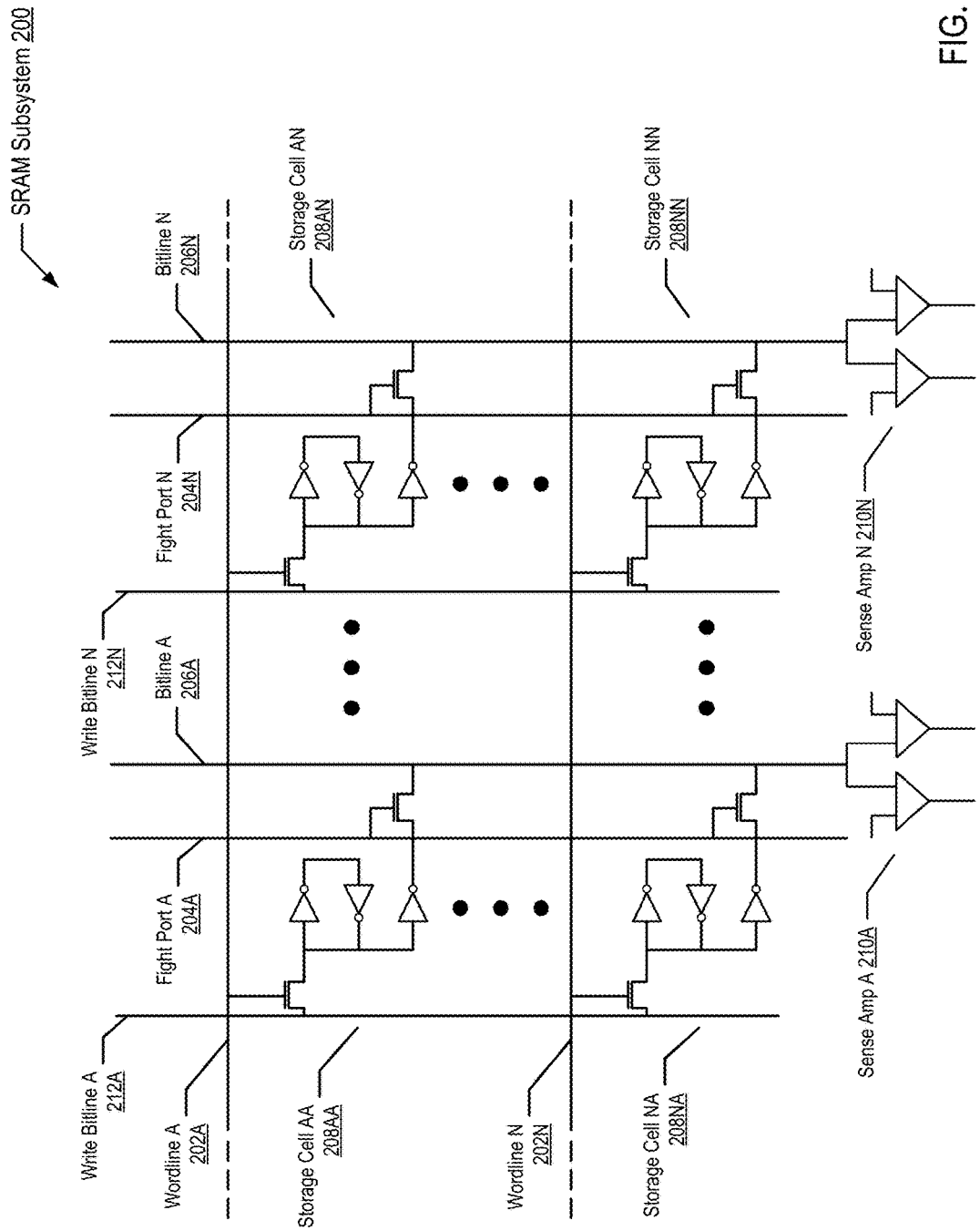
FIG. 2 sets forth an electronic chip configured for predicting data correlation using multivalued logical outputs in SRAM storage cells according to embodiments of the present invention.

FIG. 2 shows elements of a modified static random access memory (SRAM) configured for predicting data correlation using multivalued logical outputs in modified static random access memory (SRAM) storage cells in accordance with the present invention. As shown in FIG. 2, the modified SRAM subsystem (200) includes multiple wordlines (wordline A (202A), wordline N (202N)), multiple write bitlines (write bitline (212A), write bitline (212N)), multiple bitlines (bitline A (206A), bitline N (206N)), and multiple storage cells (storage cell AA (208AA), storage cell AN (208AN), storage cell NA (208NA), storage cell NN (208NN)). The SRAM subsystem may be modified to include one or more fight ports (fight port A (204A), fight port N (204N)), and each corresponding bitline (bitline A (206A), bitline N (206N)) may be coupled to a sense amp (sense amp A (210A), sense amp N (210N)). Although only two wordlines, write bitlines, fight ports, and bitlines are shown, the modified SRAM may include many wordlines, write bitlines, fight ports, and bitlines, and many memory cells on each wordline and bitline. Multiple bitlines may be coupled to the same sense amp.

A chip controller (not shown) may be logic within the SRAM or operatively connected to the SRAM with functionality to operate the SRAM subsystem for big data analysis. Specifically, the chip controller may include functionality to generate a plurality of logical outputs for each of a plurality of variable sets, wherein each variable in each variable set is a data point, and wherein each logical output is a binary indication of a relationship between the data points of each variable set; write, into SRAM storage cells, each logical output of the plurality of logical outputs for each of the plurality of variable sets; and for each group of corresponding logical outputs of the plurality of logical outputs: activate a fight port for the SRAM storage cells storing corresponding logical outputs, wherein activating the fight port causes each corresponding logical output to adjust a resulting voltage based on the logical output stored in each SRAM storage cell; and measure the resulting voltage on a bitline of the activated fight port on the corresponding bitline to determine a correlation probability for the corresponding logical outputs.

Figure 3:
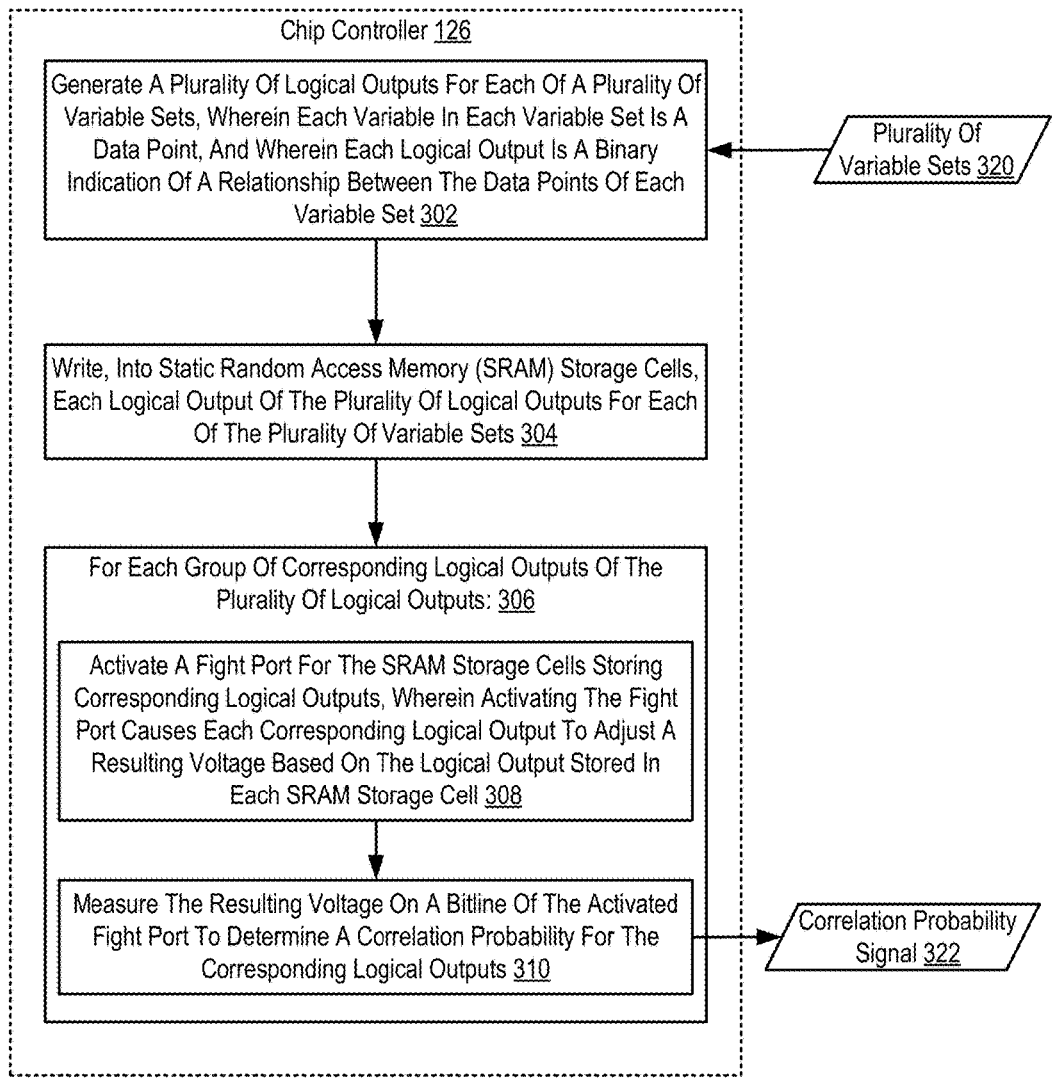
FIG. 3 sets forth a flow chart illustrating an exemplary method for predicting data correlation using multivalued logical outputs in SRAM storage cells according to embodiments of the present invention.

For further explanation, FIG. 3 sets forth a flow chart illustrating an exemplary method for predicting data correlation using multivalued logical outputs in static random access memory (SRAM) storage cells according to embodiments of the present invention. The method of FIG. 3 includes generating (302) a plurality of logical outputs for each of a plurality of variable sets (320), wherein each variable in each variable set is a data point, and wherein each logical output is a binary indication of a relationship between the data points of each variable set. Generating (302) a plurality of logical outputs for each of a plurality of variable sets (320), wherein each variable in each variable set is a data point, and wherein each logical output is a binary indication of a relationship between the data points of each variable set may be carried out by receiving a variable set and applying a group of logical operations on the variable set to obtain the logical outputs.

A data point may be a binary indication of a test result. A variable set is a group of related data points, such as tests results of tests performed under the same conditions. For example, a college clothing store may wish to evaluate the correlation between weather and sweatshirts sold. For this example, there may be two data points for a given day—first whether the outside temperature is below 45 degrees, and whether more than three sweatshirts are sold per hour. The pair of data points for each day (i.e., same conditions) would constitute a variable set.

As another example, a group of tests may be performed on a non-yielding chip. Each test is a data point indicating whether the test passed or failed. Each group of data points for a single non-yielding chip would constitute a variable set.

The logical output for a variable set is the result of logical operations applied to the variable set. Each logical output may be a bit, such as a high bit (i.e., '1') or a low bit (i.e., '0'). A logical operation may be the result of adding, as inputs, data points as a variable set to a logic gate or logic gates, and receiving, as an output of the logic gate or logic gates, the logical output. Table 1 shows the logical outputs for a set of four example variable sets.

TABLE 1

| Variable 1 | Variable 2 | XOR | Result 1 | Result 2 | Result 3 | Result 4 |
|---|---|---|---|---|---|---|
| 0 | 0 | 0 | 0 | 0 | 0 | 1 |
| 0 | 1 | 1 | 0 | 0 | 1 | 0 |
| 1 | 0 | 1 | 0 | 1 | 0 | 0 |
| 1 | 1 | 0 | 1 | 0 | 0 | 0 |

The above table shows an example of a variable set that includes two binary data points (variable 1 and variable 2). The first logical operation, exclusive OR (XOR), is a determination of whether one, and only one, of the data points is 1. The logical output of the logical operation as applied to each of the variable sets is presented in the XOR column of the table. For example, the logical output for the XOR logical operation applied to the variable set '00' is '0'.

The result (result 1, results 2, result 3, result 4) operations each correspond to one of four possible variable set combinations. Specifically, the logical operation for result 1 determines whether the variable set is equal to '11', result 2 determines whether the variable set is equal to '10', result 3 determines whether the variable set is equal to '01', and result 4 determines whether the variable set is equal to '00'. The logical output of the logical operation as applied to each of the variable sets is presented in the result columns of the table. For example, the logical output for the result 1 logical operation applied to the variable set '11' is '1'.

Returning to the college clothing store example, assume that variable 1 indicates whether more than 3 sweatshirts are sold per hour, and variable 2 indicates whether the outdoor temperature is below 45 degrees. The XOR asks if selling three sweatshirts an hour correlates to an outdoor temperature below 45 degrees while selling fewer than three sweatshirts an hour correlates to an outdoor temperature above 45 degrees. Result 1 asks if selling more than three sweatshirts an hour correlates to outdoor temperature being below 45 degrees. Result 2 asks if selling more than three sweatshirts an hour correlates to outdoor temperature being above 45 degrees. Result 3 asks if selling fewer than three sweatshirts an hour correlates to outdoor temperature being below 45 degrees. Result 4 asks if selling fewer than three sweatshirts an hour correlates to outdoor temperature being above 45 degrees.

The method of FIG. 3 also includes writing (304), into SRAM storage cells, each logical output of the plurality of logical outputs for each of the plurality of variable sets. Writing (304), into SRAM storage cells, each logical output of the plurality of logical outputs for each of the plurality of variable sets may be carried out by activating a wordline and placing the logical outputs on a write bitline or group of write bitlines to store the logical outputs in storage cells along the wordline. Subsequent logical outputs may be stored on different wordlines such that the logical outputs stored on the storage cells of the same bitline are corresponding logical outputs (i.e., logical outputs for the same logical operation performed on different variable sets). For example, the storage cells on one bitline may be logical outputs for the XOR logical operation applied to different variable sets.

Different logical outputs may be placed on adjacent storage cells along the wordline. Further, one group of logical outputs (i.e., the logical outputs for one variable set) may be placed adjacent on the same wordline to another group of logical outputs (i.e., the logical outputs for another variable set). For example, assume a first set of logical outputs is 10010 and a second set of logical outputs is 10100. The logical outputs may be stored on storage cells along a wordline as 1001010100, with the first and sixth logical outputs being corresponding logical outputs.

The method of FIG. 3 also includes for each group of corresponding logical outputs of the plurality of logical outputs (306): activating (308) a fight port for the SRAM storage cells storing corresponding logical outputs, wherein activating the fight port causes each corresponding logical output to adjust a resulting voltage based on the logical output stored in each SRAM storage cell. Activating (308) a fight port for the SRAM storage cells storing corresponding logical outputs, wherein activating the fight port causes each corresponding logical output to adjust a resulting voltage based on the logical output stored in each SRAM storage cell may be carried out by using the fight port to activate a plurality of storage cells on a bitline of the SRAM. Once activated, each storage cell applies, to the fight port, a voltage corresponding to the logical output bit stored in each storage cell. The voltage from each storage cell combines to form a resulting voltage on the bitline.

Corresponding logical outputs are logical outputs for the same logical operation performed on different variable sets. Returning to the example of Table 1, each logical output in the XOR column of Table 1 is a corresponding logical output. The storage cells along one fight port may each store corresponding logical outputs. Activating a single fight port may transfer the voltage stored in each storage cell to a sense amp or group of sense amps as a resulting voltage.

The method of FIG. 3 also includes measuring (310) the resulting voltage on a bitline of the activated fight port to determine a correlation probability (322) for the corresponding logical outputs. Measuring (310) the resulting voltage on a bitline of the activated fight port to determine a correlation probability (322) for the corresponding logical outputs may be carried out by determining a percentage of high and low bits stored in the storage cells along the fight port corresponding to the resulting voltage. For example, if the resulting voltage is exactly between a maximum expected voltage (if each storage cell stored a high bit) and a minimum expected voltage (if each storage cell stored a low bit), the chip controller would determine that half of the logical outputs were high bits and half were low bits. Consequently, the variables in the variable set would be determined to be statistically independent with regard to the logical operation that led to the particular logical output. The correlation probability signal (322) may then output a low bit or '0' indicating a low probability of correlation.

Figure 4:
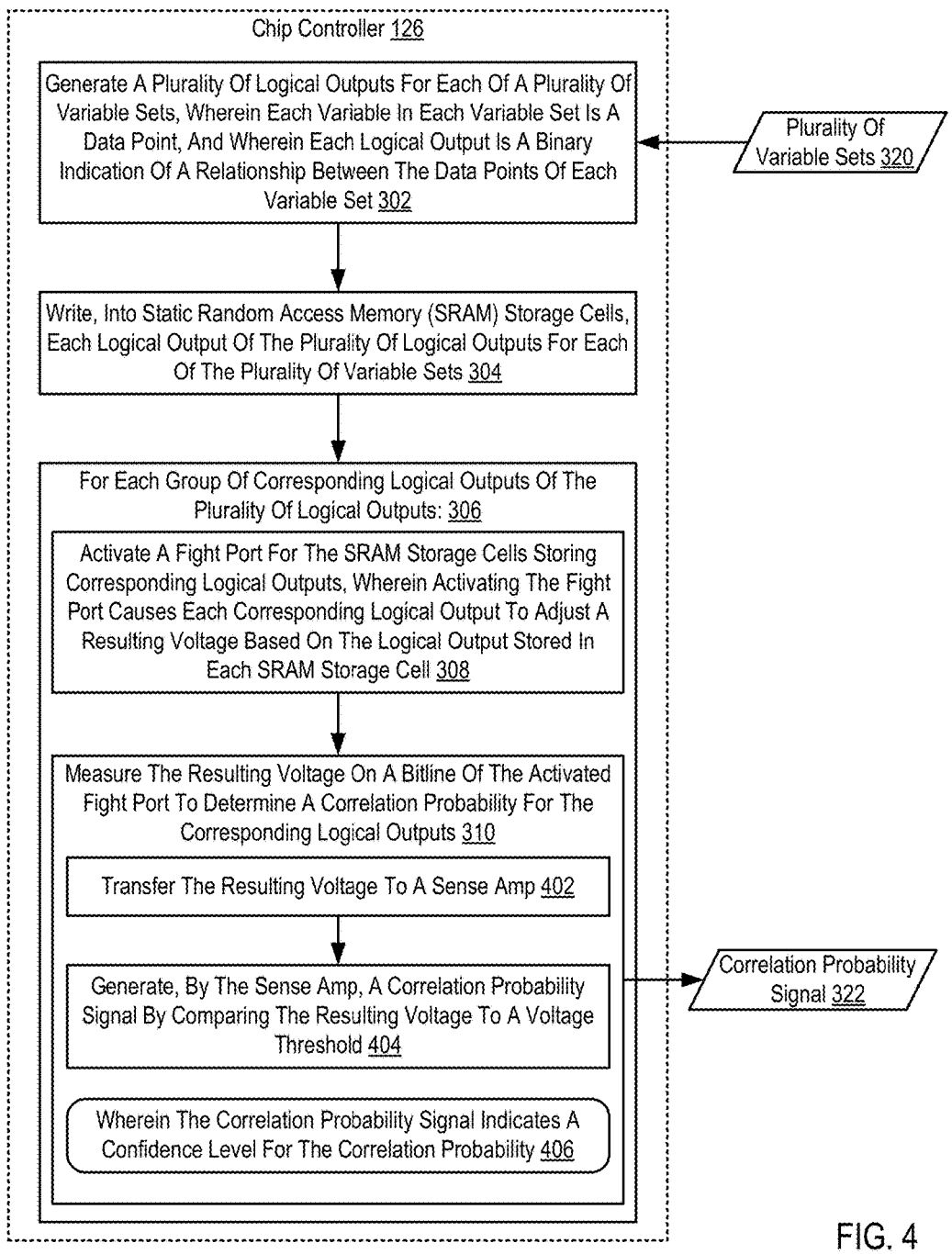
FIG. 4 sets forth a flow chart illustrating an exemplary method for predicting data correlation using multivalued logical outputs in SRAM storage cells according to embodiments of the present invention.

For further explanation, FIG. 4 sets forth a flow chart illustrating an exemplary method for predicting data correlation using multivalued logical outputs in SRAM storage cells according to embodiments of the present invention that includes generating (302) a plurality of logical outputs for each of a plurality of variable sets (320), wherein each variable in each variable set is a data point, and wherein each logical output is a binary indication of a relationship between the data points of each variable set; writing (304), into SRAM storage cells, each logical output of the plurality of logical outputs for each of the plurality of variable sets; and for each group of corresponding logical outputs of the plurality of logical outputs (306): activating (308) a fight port for the SRAM storage cells storing corresponding logical outputs, wherein activating the fight port causes each corresponding logical output to adjust a resulting voltage based on the logical output stored in each SRAM storage cell; and measuring (310) the resulting voltage on a bitline of the activated fight port to determine a correlation probability (322) for the corresponding logical outputs.

The method of FIG. 4 differs from the method of FIG. 3, however, in that measuring (310) the resulting voltage on a bitline of the activated fight port to determine a correlation probability (322) for the corresponding logical outputs includes transferring (402) the resulting voltage to a sense amp; and generating (404), by the sense amp, a correlation probability signal by comparing the resulting voltage to a voltage threshold, wherein (406) the correlation probability signal indicates a confidence level for the correlation probability. Transferring (402) the resulting voltage to a sense amp may be carried out by charging, from the one or more fight ports, one or more sense amps coupled to one or more bitlines.

Generating (404), by the sense amp, a correlation probability signal by comparing the resulting voltage to a voltage threshold may be carried out by a sense amp receiving the resulting voltage and a threshold voltage and determining which voltage is higher. The sense amp may send, on a correlation output signal line, a potential correlation signal (322) that indicates whether the resulting voltage is higher than the threshold voltage.

For example, the bitline may be coupled to a sense amp programmed with a threshold voltage equal to 80% of the highest expected voltage. The sense amp compares the resulting voltage to the threshold voltage to determine which voltage is greater. If the resulting voltage from the bitline is 90% of the highest expected voltage, then the sense amp would indicate that the resulting voltage exceeds the threshold voltage.

Wherein (406) the correlation probability signal indicates a confidence level for the correlation probability may be carried out by programming a sense amp or a group of sense amps with threshold voltages that correspond to threshold amounts of logical output results that indicate a correlation. For example, two statistically independent variables may be expected to generate a 50/50 mix of logical outputs. If the resulting voltage indicates that the percentage of logical outputs that are 1s is above a statistical threshold, then there is a probable correlation between the data points. Table 2 shows the statistical thresholds for the XOR logical operation from the earlier example for a 95% confidence that there is correlation between the data points and a 99% confidence that there is a correlation between the data points.

TABLE 2

| Confidence | Population | Expected 1s | Expected 0s | Range Low | Range High |
|---|---|---|---|---|---|
| 95% | 256 | 128 | 128 | 113 | 144 |
| 99% | 256 | 128 | 128 | 106 | 150 |

Because an even split of 1s and 0s is expected for statistically independent variables, a significant variation from that ratio suggests a probable correlation. As shown in Table 2, for 95% confidence that a correlation exists given 256 corresponding logical outputs, fewer than 113 or more than 144 data points that are is would be expected. For 99% confidence that a correlation exists, fewer than 106 or more than 150 data points that are is would be expected. This may be programmed into a pair of sense amps. A 95% confidence sense amp may be programmed with a high voltage threshold of 56% (144÷256) of the highest expected voltage and a low voltage threshold of 44% of the highest expected voltage. If the resulting voltage exceeds the high voltage threshold of 56% or if the resulting voltage is below the low voltage threshold of 44%, then the correlation probability signal would indicate that there is a 95% probable correlation between the data points for the XOR logical operation. A 99% confidence sense amp may be programmed with a high voltage threshold of 59% of the highest expected voltage and a low voltage threshold of 41% of the highest expected voltage. If the resulting voltage exceeds the high voltage threshold of 59% or if the resulting voltage is below the low voltage threshold of 41%, then the correlation probability signal would indicate that there is a 99% probable correlation between the data points for the XOR logical operation.

Table 3 shows the statistical thresholds for the result 1, result 2, result 3, and result 4 logical operations from the earlier example for a 95% confidence that there is correlation between the data points and a 99% confidence that there is a correlation between the data points.

TABLE 3

| Confidence | Population | Expected 1 s | Expected 0 s | Range Low 1 s | Range High 1 s | Range Low 0 s | Range High 0 s |
|---|---|---|---|---|---|---|---|
| 95% | 256 | 64 | 192 | 51 | 78 | 178 | 205 |
| 99% | 256 | 64 | 192 | 46 | 82 | 174 | 210 |

Because each of the result logical operations would expect 25% is for statistically independent variables, a significant variation from that ratio suggests a probable correlation. As shown in Table 3, for 95% confidence that a correlation exists given 256 corresponding logical outputs, fewer than 51 or more than 78 data points that are is would be expected. For 99% confidence that a correlation exists, fewer than 46 or more than 82 data points that are 1s would be expected. This may be programmed into a pair of sense amps.

A 95% confidence sense amp may be programmed with a high voltage threshold of 30% (78÷256) of the highest expected voltage and a low voltage threshold of 20% of the highest expected voltage. If the resulting voltage exceeds the high voltage threshold of 30% or if the resulting voltage is below the low voltage threshold of 20%, then the correlation probability signal would indicate that there is a 95% probable correlation between the data points for the result 1, result 2, result 3, or result 4 logical operation.

A 99% confidence sense amp may be programmed with a high voltage threshold of 32% of the highest expected voltage and a low voltage threshold of 18% of the highest expected voltage. If the resulting voltage exceeds the high voltage threshold of 32% or if the resulting voltage is below the low voltage threshold of 18%, then the correlation probability signal would indicate that there is a 99% probable correlation between the data points for the result 1, result 2, result 3, or result 4 logical operation. The correlation probability signal (322) may include multiple wires, pins, or other mediums through which the SRAM and/or the chip controller (126) may indicate whether a threshold was exceed.

Figure 5:
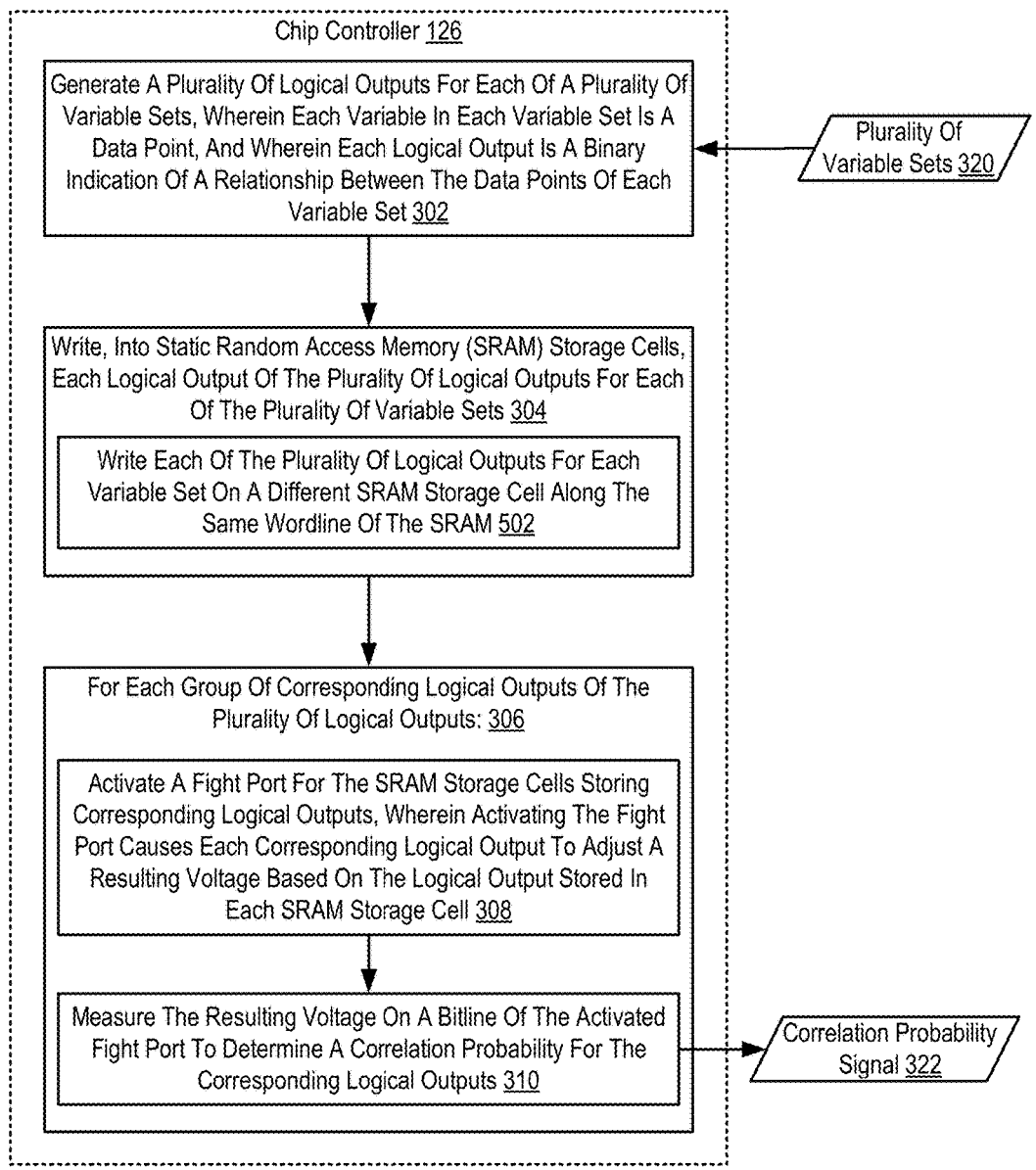
FIG. 5 sets forth a flow chart illustrating an exemplary method for predicting data correlation using multivalued logical outputs in SRAM storage cells according to embodiments of the present invention.

For further explanation, FIG. 5 sets forth a flow chart illustrating an exemplary method for predicting data correlation using multivalued logical outputs in SRAM storage cells according to embodiments of the present invention that includes generating (302) a plurality of logical outputs for each of a plurality of variable sets (320), wherein each variable in each variable set is a data point, and wherein each logical output is a binary indication of a relationship between the data points of each variable set; writing (304), into SRAM storage cells, each logical output of the plurality of logical outputs for each of the plurality of variable sets; and for each group of corresponding logical outputs of the plurality of logical outputs (306): activating (308) a fight port for the SRAM storage cells storing corresponding logical outputs, wherein activating the fight port causes each corresponding logical output to adjust a resulting voltage based on the logical output stored in each SRAM storage cell; and measuring (310) the resulting voltage on a bitline of the activated fight port to determine a correlation probability (322) for the corresponding logical outputs.

The method of FIG. 5 differs from the method of FIG. 3, however, in that writing (304), into static random access memory (SRAM) storage cells, each logical output of the plurality of logical outputs for each of the plurality of variable sets includes writing (502) each of the plurality of logical outputs for each variable set on a different SRAM storage cell along the same wordline of the SRAM. Writing (502) each of the plurality of logical outputs for each variable set on a different SRAM storage cell along the same wordline of the SRAM may be carried out by placing the logical outputs on a bitline or group of bitlines. Subsequent logical outputs may be stored on different wordlines such that the logical outputs stored on the storage cells of the same bitline are corresponding logical outputs (i.e., logical outputs for the same logical operation performed on different variable sets).

In view of the explanations set forth above, readers will recognize that the benefits of predicting data correlation using multivalued logical outputs in static random access memory (SRAM) storage cells according to embodiments of the present invention include:

- Improving the operation of a computer system by utilizing the features of a modified SRAM chip to perform near-real-time analysis of test results that is orders of magnitude more efficient than traditional methods and requires less time.
- Improving the operation of a computer system by modifying an SRAM chip to quickly and efficiently evaluate large amounts of data to approximate trends and flag potential correlations, increasing data evaluation efficiency.

Exemplary embodiments of the present invention are described largely in the context of a fully functional computer system for predicting data correlation using multivalued logical outputs in static random access memory (SRAM) storage cells. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of predicting data correlation using multi-valued logical outputs in modified static random access memory (SRAM) storage cells comprising:
   writing, into modified SRAM storage cells, a plurality of logical outputs for each of a plurality of variable sets, wherein each variable in each variable set is a data point, and wherein each logical output is a binary indication of a relationship between the data points of each variable set; and
   for each group of corresponding logical outputs of the plurality of logical outputs:
   activating a fight port for the modified SRAM storage cells storing corresponding logical outputs, wherein activating the fight port causes each corresponding logical output to adjust a resulting voltage based on the logical output stored in each modified SRAM storage cell, wherein the resulting voltage on a bitline of the activated fight port determines a correlation probability for the corresponding logical outputs.

2. The method of claim 1, wherein measuring the resulting voltage on the bitline of the activated fight port to determine a correlation probability for the corresponding logical outputs comprises:
   transferring the resulting voltage to a sense amp; and
   generating, by the sense amp, a correlation probability signal by comparing the resulting voltage to a voltage threshold.

3. The method of claim 2, wherein the correlation probability signal indicates a confidence level for the correlation probability.

4. The method of claim 1, wherein the each of the logical outputs are generated by applying a different logic operation to each of the plurality of variable sets.

5. The method of claim 1, wherein the fight port activates a plurality of storage cells on a bitline of the modified SRAM, and wherein the resulting voltage is applied to the bitline of the fight port.

6. The method of claim 1, wherein writing, into modified SRAM cells, each logical output of the plurality of logical outputs for each of the plurality of variable sets comprises:
   writing each of the plurality of logical outputs for each variable set on a different modified SRAM storage cell along the same wordline of the modified SRAM.

7. The method of claim 1, wherein the fight port is operatively coupled to a group of modified SRAM storage cells on different wordlines.

8. An apparatus for predicting data correlation using multivalued logical outputs in modified static random access memory (SRAM) storage cells, the apparatus configured to carry out the steps of:
   wherein each variable in each variable set is a data point, and wherein each logical output is a binary indication of a relationship between the data points of each variable set;
   writing, into modified SRAM storage cells, a plurality of logical outputs for each of a plurality of variable sets, wherein each variable in each variable set is a data point, and wherein each logical output is a binary indication of a relationship between the data points of each variable set; and
   for each group of corresponding logical outputs of the plurality of logical outputs:
   activating a fight port for the modified SRAM storage cells storing corresponding logical outputs, wherein activating the fight port causes each corresponding logical output to adjust a resulting voltage based on the logical output stored in each modified SRAM storage cell, wherein the resulting voltage on a bitline of the activated fight port determines a correlation probability for the corresponding logical outputs.

9. The apparatus of claim 8, wherein measuring the resulting voltage on a bitline of the activated fight port to determine a correlation probability for the corresponding logical outputs comprises:
   transferring the resulting voltage to a sense amp; and
   generating, by the sense amp, a correlation probability signal by comparing the resulting voltage to a voltage threshold.

10. The apparatus of claim 9, wherein the correlation probability signal indicates a confidence level for the correlation probability.

11. The apparatus of claim 8, wherein the each of the logical outputs are generated by applying a different logic operation to each of the plurality of variable sets.

12. The apparatus of claim 8, wherein the fight port activates a plurality of storage cells on a bitline of the modified SRAM, and wherein the resulting voltage is applied to the bitline of the fight port.

13. The apparatus of claim 8, wherein writing, into modified SRAM cells, each logical output of the plurality of logical outputs for each of the plurality of variable sets comprises:
   writing each of the plurality of logical outputs for each variable set on a different modified SRAM storage cell along the same wordline of the modified SRAM.

14. The apparatus of claim 8, wherein the fight port is operatively coupled to a group of modified SRAM storage cells on different wordlines.

15. A computer program product for predicting data correlation using multivalued logical outputs in modified static random access memory (SRAM) storage cells, the computer program product disposed upon a computer readable medium, the computer program product comprising computer program instructions that, when executed, cause a computer to carry out the steps of:
   writing, into modified SRAM storage cells, a plurality of logical outputs for each of a plurality of variable sets, wherein each variable in each variable set is a data point, and wherein each logical output is a binary indication of a relationship between the data points of each variable set; and
   for each group of corresponding logical outputs of the plurality of logical outputs:
   activating a fight port for the modified SRAM storage cells storing corresponding logical outputs, wherein activating the fight port causes each corresponding logical output to adjust a resulting voltage based on the logical output stored in each modified SRAM storage cell, wherein the resulting voltage on a bitline of the activated fight port determines a correlation probability for the corresponding logical outputs.

16. The computer program product of claim 15, wherein measuring the resulting voltage on a bitline of the activated fight port to determine a correlation probability for the corresponding logical outputs comprises:
   transferring the resulting voltage to a sense amp; and
   generating, by the sense amp, a correlation probability signal by comparing the resulting voltage to a voltage threshold.

17. The computer program product of claim 16, wherein the correlation probability signal indicates a confidence level for the correlation probability.

18. The computer program product of claim 15, wherein the each of the logical outputs are generated by applying a different logic operation to each of the plurality of variable sets.

19. The computer program product of claim 15, wherein the fight port activates a plurality of storage cells on a bitline of the modified SRAM, and wherein the resulting voltage is applied to the bitline of the fight port.

20. The computer program product of claim 15, wherein writing, into modified SRAM cells, each logical output of the plurality of logical outputs for each of the plurality of variable sets comprises:
   writing each of the plurality of logical outputs for each variable set on a different modified SRAM storage cell along the same wordline of the modified SRAM.

* * * * *